(12) United States Patent
Feng et al.

(10) Patent No.: US 7,693,195 B2
(45) Date of Patent: Apr. 6, 2010

(54) SEMICONDUCTOR LIGHT EMITTING DEVICES AND METHODS

(75) Inventors: Milton Feng, Champaign, IL (US); Nick Holonyak, Jr., Urbana, IL (US); Richard Chan, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 221 days.

(21) Appl. No.: 12/008,796

(22) Filed: Jan. 14, 2008

(65) Prior Publication Data

US 2008/0310467 A1 Dec. 18, 2008

Related U.S. Application Data

(63) Continuation-in-part of application No. 11/068,561, filed on Feb. 28, 2005, now Pat. No. 7,286,583, which is a continuation-in-part of application No. 10/861,103, filed on Jun. 4, 2004, now Pat. No. 7,091,082, and a continuation-in-part of application No. 10/861,320, filed on Jun. 4, 2004, which is a continuation-in-part of application No. 10/646,457, filed on Aug. 22, 2003, now abandoned.

(51) Int. Cl.
*H01S 3/13* (2006.01)
(52) U.S. Cl. ............... 372/30; 372/1; 372/11; 372/38.1; 372/87
(58) Field of Classification Search ............ 372/1, 372/11, 30, 38.1
See application file for complete search history.

(56) References Cited

U.S. PATENT DOCUMENTS

| | | |
|---|---|---|
| 2,569,347 A | 9/1951 | Shockley |
| 4,485,391 A | 11/1984 | Poulain et al. ......... 357/19 |
| 4,710,936 A * | 12/1987 | Shibata et al. ......... 372/45.01 |
| 4,845,535 A | 7/1989 | Yamanishi et al. ......... 315/172 |

(Continued)

FOREIGN PATENT DOCUMENTS

JP    61231788    10/1986

(Continued)

OTHER PUBLICATIONS

P. Grossman, and J. Choma, Jr., "Large Signal Modeling of HBT's Including Self-Heating and Transit Time Effects" IEEE Transactons On Microwave Theory And Techniques, vol. 40, No. 3, Mar. 1992.

(Continued)

*Primary Examiner*—Dung T Nguyen
(74) *Attorney, Agent, or Firm*—Martin Novack

(57) ABSTRACT

A method for producing an optical output, including the following steps: providing first and second electrical signals; providing a bipolar light-emitting transistor device that includes collector, base, and emitter regions; providing a collector electrode coupled with the collector region and an emitter electrode coupled with the emitter region, and coupling electrical potentials with respect to the collector and emitter electrodes; providing an optical coupling in optical communication with the base region; providing first and second base electrodes coupled with the base region; and coupling the first and second electrical signals with the first and second base electrodes, respectively, to produce an optical output emitted from the base region and coupled into the optical coupling, the optical output being a function of the first and second electrical signals.

19 Claims, 12 Drawing Sheets

U.S. PATENT DOCUMENTS

| | | | | |
|---|---|---|---|---|
| 4,958,208 | A | 9/1990 | Tanaka | 357/34 |
| 5,003,366 | A | 3/1991 | Mishima et al. | 357/34 |
| 5,239,550 | A | 8/1993 | Jain | 372/45 |
| 5,293,050 | A | 3/1994 | Chapple-Sokol et al. | 257/17 |
| 5,334,854 | A | 8/1994 | Ono et al. | 257/13 |
| 5,389,804 | A | 2/1995 | Yokoyama et al. | 257/17 |
| 5,399,880 | A | 3/1995 | Chand | 257/21 |
| 5,414,273 | A | 5/1995 | Shimura et al. | 257/17 |
| 5,588,015 | A | 12/1996 | Yang | 372/45.012 |
| 5,684,308 | A | 11/1997 | Lovejoy et al. | 257/184 |
| 5,723,872 | A | 3/1998 | Seabaugh et al. | 257/25 |
| 5,780,880 | A | 7/1998 | Enquist | 257/197 |
| 5,796,714 | A | 8/1998 | Chino et al. | 372/45 |
| 6,337,494 | B1 | 1/2002 | Ryum et al. | 257/197 |
| 6,479,844 | B2 | 11/2002 | Taylor | 257/192 |
| 6,737,684 | B1 | 5/2004 | Takagi et al. | 257/194 |
| 2002/0030195 | A1 | 3/2002 | Yoshii et al. | 257/101 |
| 2004/0094760 | A1* | 5/2004 | Taylor et al. | 257/40 |

OTHER PUBLICATIONS

Y. Mori, J. Shibata, Y. Sasai, H. Serizawa, and T. Kajiwara, "Operation Principle Of The InGaAsP/InP Laser Transistor", Appl. Phys. Lett. 47(7), Oct. 1, 1985.

J. Genoe, C. Van Hoof, K. Fobelets, R. Mertens, and G. Borghs, "pnp Resonant Tunneling Light Emitting Transistor" Appl. Phys. Lett. 62 (9), Aug. 31, 1992.

P. Berger, N. Chand, and N. Dutta, "An AlGaAs Double-Heterojunction Bipolar Transistor Grown By Molecular-Beam Epitaxy", Appl. Phys. Lett. 59(9), Aug. 26, 1991.

E. Zanoni, L. Vendrame, and P. Pavan, "Hot-Electron Electroluminescence in AlGaAs/GaAs Heterojunction Bipolar Transistors", Appl. Phys. Lett. 62 (4), Jan. 25, 1993.

M. Harris, B. Wagner, S. Halpern and M. Dobbs, "Full Two-Dimensional Electroluminescent (EL) Analysis of GaAs/AlGaAs HBT's", IEEE 99CH36296. 37$^{th}$ Annual International Reliability Physics Symposium, San Diego., California, 1999.

K. Wang, P. Asbeck, M. Chang, G. Sullivan, and D. Millar, "Noninterfering Optical Method Of HBT Circuit Evaluation", Electronics Letters, vol. 25 No. 17, Aug. 17, 1989.

J. Bardeen and W.H. Brattain, "The Transistor, A Semi-conductor Triode," Physical Review 74, 230-234 (1948).

W. Shockley, "The Theory of p-n Junctions in Semiconductors and p-n Junction Transistors," Bell System Technology Journal 28, 435-489 (1949).

R.N. Hall, G.E. Fenner, J.D. Kingsley, T.J. Soltys, and R.O. Carlson, "Coherent Light Emission From GaAs Junctions, " Phys. Rev. Lett., vol. 9. pp. 366-368, Nov. 1, 1962.

M.I. Nathan, W.P. Dumke, G. Burns, F.H. Dill, Jr., and G. Lasher, "Stimulated Emission of Radiation From GaAs p-n Junction," Appl. Phys. Lett., vol. 1, pp. 62-64. Nov. 1962.

N. Holonyak, Jr. and S.F. Bevacqua, "Coherent (Visible) Light Emission From GaAs$_{1-x}$P$_x$ Junctions," Appl. Phys. Lett., vol. 1, pp. 82-83, Dec. 1962.

T.M. Quist, R.H. Rediker, R.J. Keyes, W.E. Krag, B. Lax, A.L. McWhorter, and H.J. Zeiger, "Semiconductor Maser of GaAs," Appl. Phys. Lett., vol. 1. pp. 91-92, Nov. 1962.

H. Kroemer, "Theory Of A Wide-Gap Emitter For Transistors," Proceedings of the IRE 45, 1535-1537 (1957).

W. Hafez, J.W. Lai and M. Feng, "InP/InGaAs SHBTs with 75 nm Collector and fr>500 GHz", Electronic Letters, vol. 39, No. 20, Oct. 2003.

W. Hafez, J.W. Lai, and M. Feng "Record $f_T$ and $f_T + f_{MAX}$ Performance of InP/InGaAs Single Heterojunction Bipolar Transistors," Electronics Letters, May 2003.

W. Hafez, J.W. Lai, and M. Feng. "Sub-micron InP/InGaAs Single Heterojunction Bipolar Transistors With $f_T$ of 377 GHz," IEEE Electron Device Letters, May 2003.

W. Hafez, J.W. Lai and M. Feng, "Vertical scaling of 0.25 um Emitter InP/InGaAs Single Heterojunction Bipolar Transistors With $f_T$ of 452 GHz," IEEE Electron Devices Letters, Jul. 2003.

P. Enquist, A. Paolella, A.S. Morris, F.E. Reed, L. DeBarros, A.J. Tessmer, and J.A. Hutchby, " Performance Evaluation Of Heterojunction Bipolar Transistors Designed For High Optical Gain", Research Triangle Institute, Research Triangle Park, NC, ARL, Research Laboratory, Ft. Monmouth, NJ, Applied Research and Technology, Wake Forest, NC, , IEEE, pp. 278-287, 1995.

Yukihiko Arai, Masaaki Sakuta, Hiroshi Takano, Takashi Usikubo, Ryozo Furukawa, and Masao Kobayashi, "Optical Devices From AlGaAs-GaAs HBTs Heavily Doped With Amphoteric Si", IEEE Transactoins On Electron Devices, pp. 632-638, Vo. 42. No. 4, Apr. 1995.

G.W. Taylor, R.S. Mand, J.G. Simmons, and A.Y. Cho, "Ledistor—A Three-Terminal Double Heterostructure Optoelectronic Switch", Appl. Phys. Lett. 50 (6), Feb. 9, 1987.

N. Holonyak "Quantum-Well And Superlattice Lasers: Fundamental Effects" pp. 1-18, in "The Physics Of Submicron Structures", Plenum Press, 1984.

V. Ryzhii, M. Willander, M. Ryzhii and I. Khmyrova, "Heterostructure Laser-Transistors Controlled By Resonant-Tunnelling Electron Extraction", Semicond. Sci. Technol. 12 (1997) 431-438.

V. Ryzhi and I. Khmyrova, "Bistability Effect In Laser-Transistor Resonant-Tunneling Structure" Solid-State Electronics vol. 37 Nos. 4-6 pp. 1259-1262, 1994.

R. Bhat, W.-P. Hong, C. Caneau, M. A. Koza, C.-K. Nguyen, and S. Goswami, "InP/GaAsSb/InP And InP/GaAsSb/InGaAsP Double Heterojunction Bipolar Transistors With A Carbon-Doped Base Grown By Organometallic Chemical Vapor Deposition" Appl. Phys. Lett. 68, 985 (1996).

T. McDermott, E. R. Gertner, S. Pittman, C. W. Seabury, and M. F. Chang, "Growth And Doping Of GaAsSb Via Metalorganic Chemical Vapor Deposition For InP Heterojunction Bipolar Transistors" Appl. Phys. Lett. 58, 1386 (1996).

Dvorak, C. R. Bolognesi, O. J. Pitts, and S. P. Watkins, "300 GHz InP/GaAsSb/InP Double HBTs With High Current Capability And $BV_{CEO} \geq 6$ V" IEEE Elec. Dev. Lett. 22, 361 (2001).

V. de Walle, "Band Lineups And Deformation Potentials In The Model-Solid Theory" Physical Review B 39, 1871 (1989).

M. Feng, N. Holonyak, Jr. and W. Hafez, "Light-Emitting Transistor: : Light Emission From InGaP/GaAs Heterojunction Bipolar Transistors", Appl. Phys. Lett. 84, 151, Jan. 5, 2004.

J. Shibata, Y. Mori, Y. Sasai, N. Hase, H. Serizawa, and T. Kahwara "Fundamental Characteristics Of An InGaAsP/InP Laser Transistor", Electronic Letters, vol. 21, p. 98, 1985.

F. Jain, C. Chung, R. LaComb and M. Gokhale, "Resonant Tunneling Transistor Lasers: A New Approach To Obtain Multi-State Switching And Bistable Operation", International Journal Of Infrared And Millimeter Waves, Springer, Dordrecht, NL, vol. 14, No. 6, pp. 1311-1322, Jun. 1993.

Chun-Xia Du, Farice Duteil, Goran Hansson, and Wei-Xin Ni, "Si/SiGe/Si: Er: O Light-Emitting Transistors Prepared By Differential Molecular-Beam Epitaxy", App. Phys. Letts., vol. 78, No. 12, Mar. 19, 2001.

J. Hu et al., "Type II Photoluminescence And Conduction Band Offsets of GaAsSb/InGaAs and GaAsSb/InP Heterostructures Grown By Metalorganic Vapor Phase Epitaxy" Applied Physics Letters, 73(19) Nov. 1998.

Y. Yamashita et al., "Pseudomorphic $In_{0.52}Al_{0.48}As/In_{0.7}Ga_{0.3}As$ HEMTs With an Ultrahigh $f_T$ of 562 GHz", IEEE Electron Device Lett. 23 (10), 573-575 (2002).

* cited by examiner

SEMICONDUCTOR LIGHT EMITTING DEVICES AND METHODS

PRIORITY CLAIMS

The present application is a continuation-in-part of U.S. patent application Ser. No. 11/068,561, filed Feb. 28, 2005 now U.S. Pat. No. 7,286 583, which is, in turn, a continuation-in-part of two U.S. patent applications (Ser. No. 10/861,103, filed Jun. 4, 2004 now U.S. Pat. No. 7,091,082, and Ser. No. 10/861,320, filed Jun. 4, 2004) each of these two last-mentioned Applications being, in turn, a continuation-in-part of U.S. patent application Ser. No. 10/646,457, filed Aug. 22, 2003 now abandoned.

GOVERNMENT RIGHTS

This invention was made with Government support under Contract Number HR 0011-04-1-0034 awarded by the Defense Advanced Research Projects Agency (DARPA). The Government has certain rights in the invention.

FIELD OF THE INVENTION

This invention relates to semiconductor light emitting devices and methods, and also to devices and methods that include wave mixing modulation laser transistors and techniques.

BACKGROUND OF THE INVENTION

A part of the background hereof lies in the development of light emitters based on direct bandgap semiconductors such as III-V semiconductors. Such devices, including light emitting diodes and laser diodes, are in widespread commercial use.

Another part of the background hereof lies in the development of wide bandgap semiconductors to achieve high minority carrier injection efficiency in a device known as a heterojunction bipolar transistor (HBT), which was first proposed in 1948 (see e.g. U.S. Pat. No. 2,569,376; see also H. Kroemer, "Theory Of A Wide-Gap Emitter For Transistors" Proceedings Of The IRE, 45, 1535-1544 (1957)). These transistor devices are capable of operation at extremely high speeds. An InP HBT has been demonstrated to exhibit operation at a speed above 500 GHz (see W. Hafez, J. W. Lai, and M. Feng, Elec Lett. 39, 1475 (October 2003). In the parent Application hereof (the above-referenced copending U.S. patent application Ser. No. 11/068,561), very short laser pulses are produced by switching a heterojunction bipolar transistor laser back and forth between a stimulated emission mode that produces laser pulses, and a spontaneous emission mode.

It is among the objects of the present invention to produce heterojunction bipolar transistor lasers and techniques that are capable of advantageous signal processing to obtain a variety of selected optical outputs, including wave mixing modulation laser transistors and techniques.

SUMMARY OF THE INVENTION

In the above referenced prior U.S. patent application Ser. Nos. 10/646,457, 10/861,103, 10/861,320 and 11/068,561, (hereinafter, collectively, "the referenced prior applications"), all assigned to the same assignee as the present Application, there is disclosed a direct bandgap heterojunction transistor that exhibits light emission from the base layer. Modulation of the base current produces modulated light emission. [As used herein, "light" means optical radiation that can be within or outside the visible range.] The prior copending applications also disclose three port operation of a light emitting HBT. Both spontaneous light emission and electrical signal output are modulated by a signal applied to the base of the HBT.

Another aspect of the referenced prior applications involves employing stimulated emission to advantage in the base layer of a bipolar transistor (e.g. a bipolar junction transistor (BJT) or a heterojunction bipolar transistor (HBT), in order to enhance the speed of the transistor. Spontaneous emission recombination lifetime is a fundamental limitation of bipolar transistor speed. In an embodiment of the prior copending applications, the base layer of a bipolar transistor is adapted to enhance stimulated emission (or stimulated recombination) to the detriment of spontaneous emission, thereby reducing recombination lifetime and increasing transistor speed. In one embodiment, at least one layer exhibiting quantum size effects, preferably a quantum well or a layer of quantum dots, preferably undoped or lightly doped, is provided in the base layer of a bipolar transistor. At least a portion of the base layer containing the at least one layer exhibiting quantum size effects, is highly doped, and of a wider bandgap material than the at least one layer. The at least one quantum well, or layer of quantum dots, within the higher gap highly doped material, enhances stimulated recombination and reduces radiative recombination lifetime. A two-dimensional electron gas ("2-DEG") enhances carrier concentration in the quantum well or quantum dot layer, thereby improving mobility in the base region. Improvement in base resistance permits reduction in base thickness, with attendant reduction of base transport time. As described in the prior copending applications, these advantages in speed are applicable in high speed bipolar transistors in which light emission is utilized, and/or in high speed bipolar transistors in which light emission is not utilized. In light emitting bipolar transistor devices, for example heterojunction bipolar transistors of direct bandgap materials, the use of one or more layers exhibiting quantum size effects can also be advantageous in enhancing light emission and customizing the emission wavelength characteristics of the devices.

In a further embodiment disclosed in the referenced prior applications, a semiconductor laser is set forth, including: a heterojunction bipolar transistor structure comprising collector, base, and emitter of direct bandgap semiconductor materials; an optical resonant cavity enclosing at least a portion of the transistor structure; and means for coupling electrical signals with the collector, base, and emitter regions to cause laser emission from the device.

In another embodiment disclosed in the referenced prior applications, a plurality of spaced apart quantum size regions (e.g. quantum wells and/or quantum dots) having different thicknesses are provided in the base region of a bipolar transistor and are used to advantageously promote carrier transport unidirectionally through the base region. As an example, the base region can be provided with several spaced apart quantum size regions of different thicknesses, with the thicknesses of the quantum size regions being graded from thickest near the collector to thinnest near the emitter. An injected electron is captured in a smaller well, tunnels into the next bigger well, and then the next bigger well, and so forth, until, at the biggest well closest to the collector, it tunnels to and relaxes to the lowest state of the biggest well and recombines. The arrangement of wells encourages carrier transport unidirectionally from emitter toward collector. Maximum recombination and light are derived from the biggest well as near as possible to the collector, which is an advantageous position, such as for optical cavity reasons. Carriers diffuse "downhill" in energy; i.e., toward the thicker wells. The asymmetry in well size provides improved directionality and speed of carrier transport. In a light emitting HBT, light emission and device speed are both enhanced.

In accordance with a further embodiment disclosed in the referenced prior applications, and first referred to above, a device and technique are set forth for high speed optical signal generation with an enhanced signal to noise ratio and control of "on" and "off" time durations utilizing the stimulated emission process for the "on" state and spontaneous emission process for the "off" state. The operating point and excitation of the transistor laser are selected to obtain cycles that each have an "on" portion of stimulated emission (laser optical output, and electrical signal output) and an "off" portion of spontaneous emission (without sensible optical output, and electrical noise).

In accordance with an embodiment of the present invention, a method is set forth for producing an optical output, comprising the following steps: providing first and second electrical signals; providing a bipolar light-emitting transistor device that includes collector, base, and emitter regions; providing a collector electrode coupled with said collector region and an emitter electrode coupled with said emitter region, and coupling electrical potentials with respect to said collector and emitter electrodes; providing an optical coupling in optical communication with said base region; providing first and second base electrodes coupled with said base region; and coupling said first and second electrical signals with said first and second base electrodes, respectively, to produce an optical output emitted from said base region and coupled into the optical coupling, said optical output being a function of said first and second electrical signals. In one preferred embodiment of the invention, the step of providing a bipolar light-emitting transistor device comprises providing a laser transistor, and the optical output comprises a plurality of coupled laser beams. In a form of this embodiment, the first electrical signal has a frequency f1, the second electrical signal has a frequency f2, and said optical output includes a frequency component from the group consisting of f1+f2, |f1−f2|, 2f1+f2, 2f2+f1, |2f1−f2|, and |2f2−f1|.

In another embodiment of the invention, the step of providing first and second electrical signals comprises providing first and second controllable oscillators for producing said first and second electrical signals.

In a further embodiment of the invention, the step of providing first and second electrical signals comprises providing a signal generator for producing said first and second electrical signals, and a phase shifter for producing a phase shift between said first and second electrical signals.

Further features and advantages of the invention will become more readily apparent from the following detailed description when taken in conjunction with the accompanying drawings.

DETAILED DESCRIPTION

Figure 1:
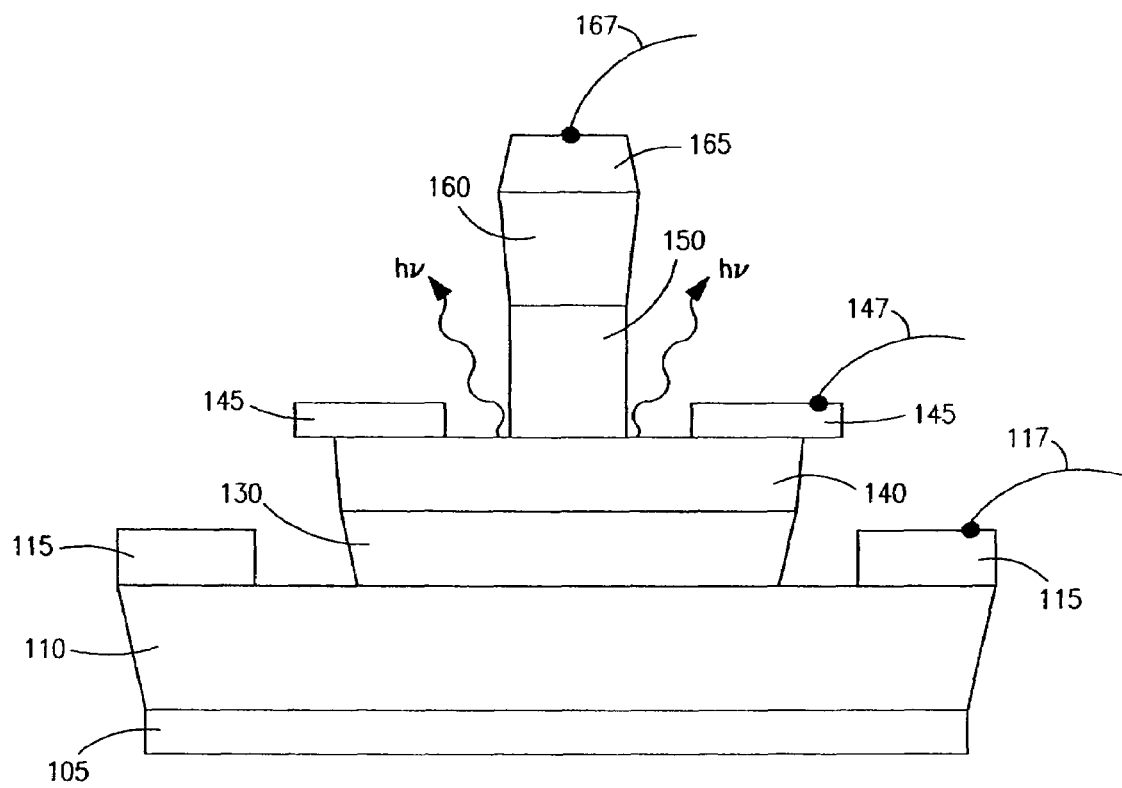
FIG. 1 is a simplified cross-sectional diagram, not to scale, of an embodiment of a heterojunction bipolar light-emitting transistor device as disclosed in the referenced prior applications.

FIG. 1 illustrates a device as described in the referenced prior applications. A substrate 105 is provided, and the following layers are disposed thereon: subcollector 110, collector 130, base 140, emitter 150, and cap layer 160. Also shown are collector metallization (or electrode) 115, base metallization 145, and emitter metallization 165. Collector lead 117, base lead 147, and emitter lead 167 are also shown. In a described form of this device, the layers were grown by MOCVD, and the collector layer 130 comprised 3000 Angstrom thick n-type GaAs, $n=2\times10^{16}$ $cm^{-3}$, the base layer 140 comprised 600 Angstrom thick p+ carbon-doped compositionally graded InGaAs (1.4% In), $p=4.5\times10^{19}$ $cm^{-3}$, the emitter layer 150 comprised 800 Angstrom thick n-type InGaP, $n=5\times10^{17}$ $cm^{-3}$, and the cap layer comprised 1000 Angstrom thick n+ InGaAs, $n=3\times10^{19}$ $cm^{-3}$.

The fabrication process sequence included e-beam defined Ti/Pt/Au emitter contacts (165), a self-aligned emitter etch, a self-aligned Ti/Pt/Au base metal deposition, a base-collector etch, and collector metal deposition. A bisbenzocyclobutene (BCB) based etch-back process was employed for "backend" fabrication (i.e., to render the electrode and contact formation on the top of the transistor).

As described in the referenced prior applications, for conventional PN junction diode operation, the recombination process is based on both an electron injected from the n-side and a hole injected from the p-side, which in a bimolecular recombination process can be limited in speed. In the case of the described HBT light emission, the base "hole" concentration is so high that when an electron is injected into the base, it recombines (bimolecular) rapidly. The base current merely re-supplies holes via relaxation to neutralize charge imbalance. For a heterojunction bipolar transistor (HBT), the base current can be classified into seven components, namely: (1) hole injection into the emitter region ($i_{Bp}$); (2) surface recombination current in the exposed extrinsic base region ($i_{Bsurf}$); (3) base ohmic contact recombination current ($i_{Bcont}$); (4) space charge recombination current ($i_{Bscr}$); (5) bulk base non-radiative recombination current due to the Hall-Shockley-Reed process (HSR) ($i_{BHSR}$); (6) bulk base Auger recombination current ($i_{BAug}$); and (7) bulk base radiative recombination current ($i_{Brad}$).

For a relatively efficient HBT with ledge passivation on any exposed base region, the surface recombination current can be reduced significantly. Hence, the base current and recombination lifetime can be approximated as primarily bulk HSR recombination, the Auger process, and radiative recombination. The base current expressed in the following equation (1) is then related to excess minority carriers, $\Delta n$, in the neutral base region, the emitter area, $A_E$, the charge, q, and the base recombination lifetime, $\tau_n$ as $$i_B = i_{BHSR} + i_{BAUG} + i_{Brad} = qA_E \Delta n / \tau_n \quad (1)$$

The overall base recombination lifetime, $\tau_n$, is related to the separate recombination components of Hall-Shockley-Read, $\tau_{HSR}$, Auger, $\tau_{AUG}$, and radiative recombination, $\tau_{rad}$, as $$\tau_n = (1/\tau_{HSR} + 1/\tau_{AUG} + 1/\tau_{rad})^{-1} \quad (2)$$

As also described in the referenced prior applications, the light emission intensity $\Delta l$ in the base is proportional to $i_{Brad}$ and is related to the minority carrier electron with the majority hole over the intrinsic carrier concentration, $(np - n_i^2)$, in the neutral base region and the rate of radiative recombination process, B, set forth in Equation (3) below, where the hole concentration can be approximated as equal to base dopant concentration, $N_B$. The radiative base current expressed in equation (3) is then related to excess minority carriers, $\Delta n$, in the neutral base region, and the base recombination lifetime, $\tau_{rad}$ as $$i_{Brad} = qA_E B(np - n_i^2) = qA_E Bnp = qA_E \Delta n (BN_B) = qA_E \Delta n / \tau_{rad} \quad (3)$$

For a high speed HBT, it is easy to predict that the base recombination lifetime can be less than half of the total response delay time. Hence, the optical recombination process in the base should be at least two times faster than the speed of the HBT. In other words, HBT speed, which can be extremely fast, is limiting.

Figure 2:
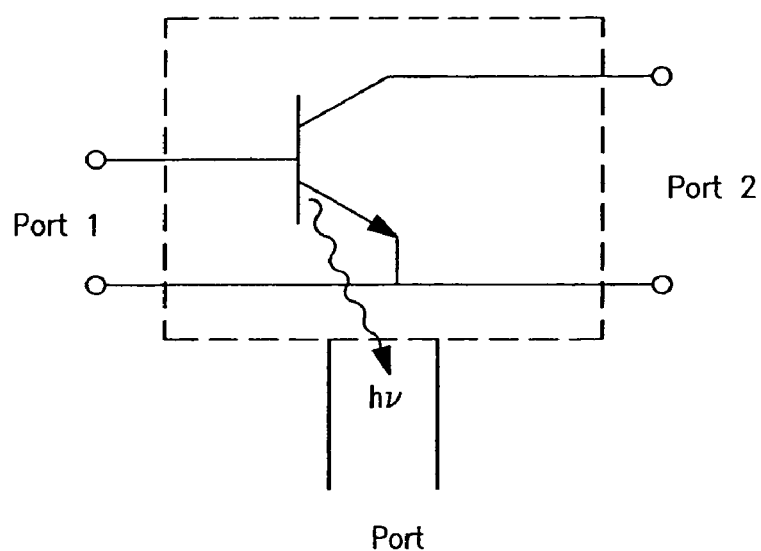
FIG. 2 is a simplified schematic diagram of a three port device as disclosed in the referenced prior applications.

In typical transistor operation, one of the three terminals of a transistor is common to both the input and output circuits. This leads to familiar configurations known as common emitter (CE), common base (CB), and common collector (CC). The common terminal (often ground reference) can be paired with one or the other of the two remaining terminals. Each pair is called a port, and two pairs for any configurations are called a two-port network. The two ports are usually identified as an input port and as an output port. As described in the referenced prior applications, and as illustrated in FIG. 2, a third port, namely an optical output port, is provided, and is based on (recombination-radiation) emission from the base layer of the HBT light emitter. For the HBT of FIG. 1 operated, for example, with a common emitter configuration, when an electrical signal is applied to the input port (Port 1), there results simultaneously an electrical output with signal amplification at Port 2 and optical output with signal modulation of light emission at Port 3.

Figure 3:
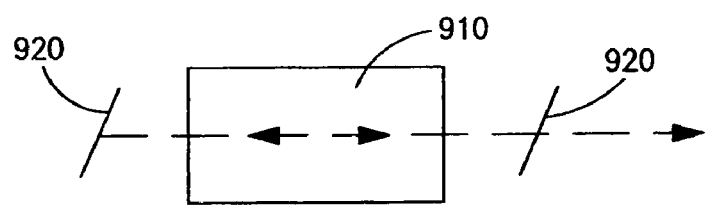
FIG. 3 illustrates reflectors used in a bipolar transistor laser device as disclosed in the referenced prior applications.

As described in the referenced prior applications, FIG. 3 illustrates the three terminal light emitting HBT, 910, in a lateral cavity, represented at 920, for operation as a lateral gain guided laser. The lateral cavity may be defined, for example, by cleaved edges on or near the light emitting region.

As described in the referenced prior applications, stimulated emission can be employed to advantage in the base layer of a bipolar transistor (e.g. a bipolar junction transistor (BJT) or a heterojunction bipolar transistor (HBT), in order to enhance the speed of the transistor. Spontaneous emission recombination lifetime is a fundamental limitation of bipolar transistor speed. The base layer of a bipolar transistor is adapted to enhance stimulated emission (or stimulated recombination) to the detriment of spontaneous emission, thereby reducing recombination lifetime and increasing transistor speed. In a form of this aspect of the invention, at least one layer exhibiting quantum size effects, preferably a quantum well or a layer of quantum dots, preferably undoped or lightly doped, is provided in the base layer of a bipolar transistor. Preferably, at least a portion of the base layer containing the at least one layer exhibiting quantum size effects, is highly doped, and of a wider bandgap material than said at least one layer. The at least one quantum well, or layer of quantum dots, within the higher gap highly doped material, enhances stimulated recombination and reduces radiative recombination lifetime. A two-dimensional electron gas ("2-DEG") enhances carrier concentration in the quantum well or quantum dot layer, thereby improving mobility in the base region. Improvement in base resistance permits reduction in base thickness, with attendant reduction of base transport time. These advantages in speed are applicable in high speed bipolar transistors in which light emission is utilized, and/or in high speed bipolar transistors in which light emission is not utilized. In light emitting bipolar transistor devices, for example heterojunction bipolar transistors of direct bandgap materials, the use of one or more layers exhibiting quantum size effects can also be advantageous in enhancing light emission and customizing the emission wavelength characteristics of the devices. Doped or highly doped quantum size regions can also be utilized.

Figure 4:
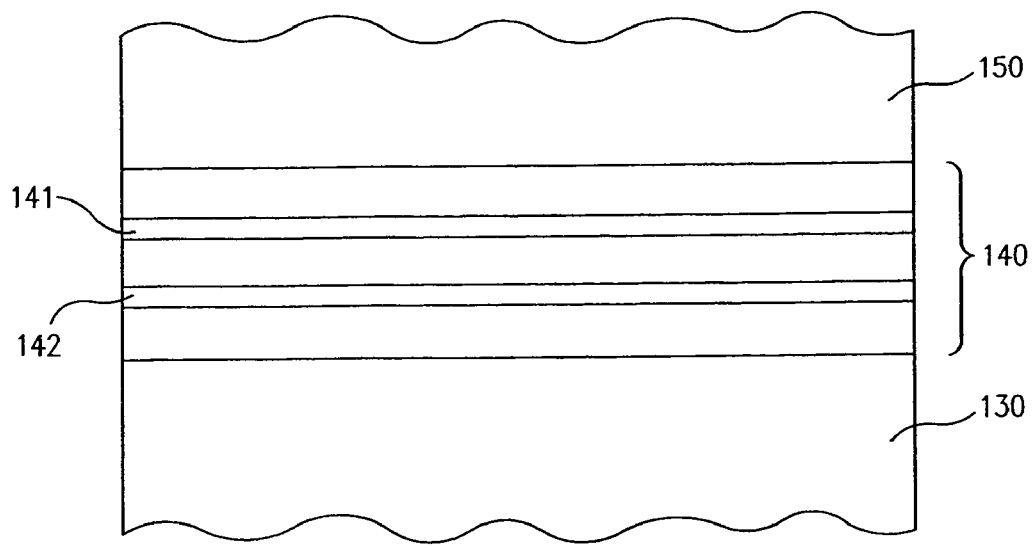
FIG. 4 shows a portion of a device disclosed in the referenced prior applications, employing one or more quantum wells.

FIG. 4 shows the use of one or more quantum wells, 141, 142, in the base region 140 of the FIG. 1 device (or other embodiments). As described in the referenced prior applications, these quantum wells are operative to enhance the recombination process for improved device speed, modulation characteristics, and/or to tailor the spectral characteristics of the device. In one embodiment, the quantum well(s) (and/or dots—see below) are of lower bandgap than the surrounding base layer (140) material and are undoped or lightly doped (e.g. below about $10^{16}$ cm$^{-3}$). The surrounding base layer (140) material is highly doped (e.g. uniformly or delta doped to at least about $10^{18}$ cm$^{-3}$ for p-type or at least about $10^{17}$ cm$^{-3}$ for n-type). In one embodiment, the quantum well (or dot) layer(s) have a thickness not greater than about 100 Angstroms.

As described in the referenced prior applications, a cavity with reflectors can be utilized laterally (e.g. FIG. 3) or vertically (e.g. FIGS. 6 and 7) to obtain controlled laser operation of a light emitting HBT. As summarized above, enhancing stimulated emission can reduce recombination lifetime, to increase speed of operation.

Figure 5A:
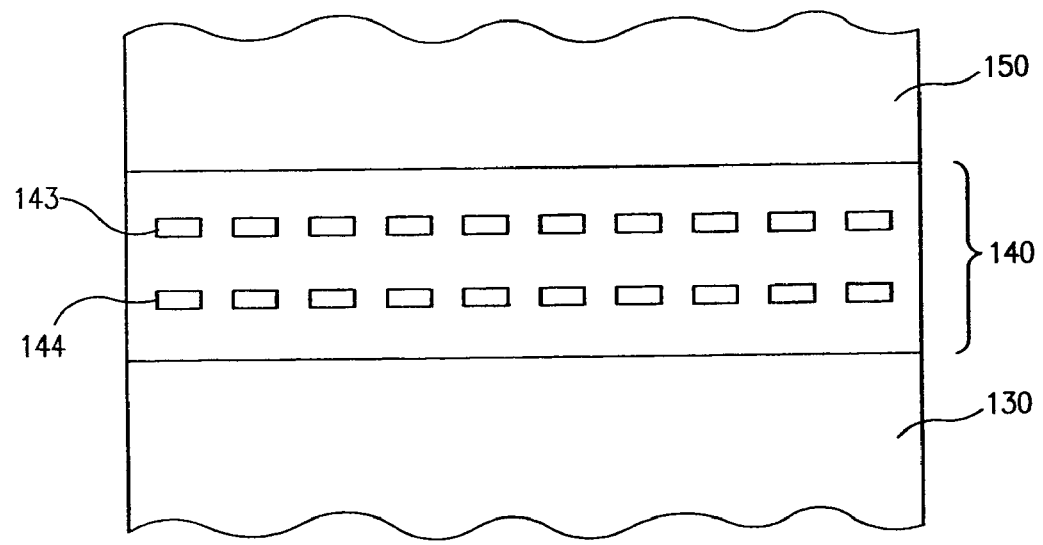
FIG. 5A shows a portion of a device disclosed in the referenced prior applications, employing one or more regions of quantum dots.
Figure 5B:
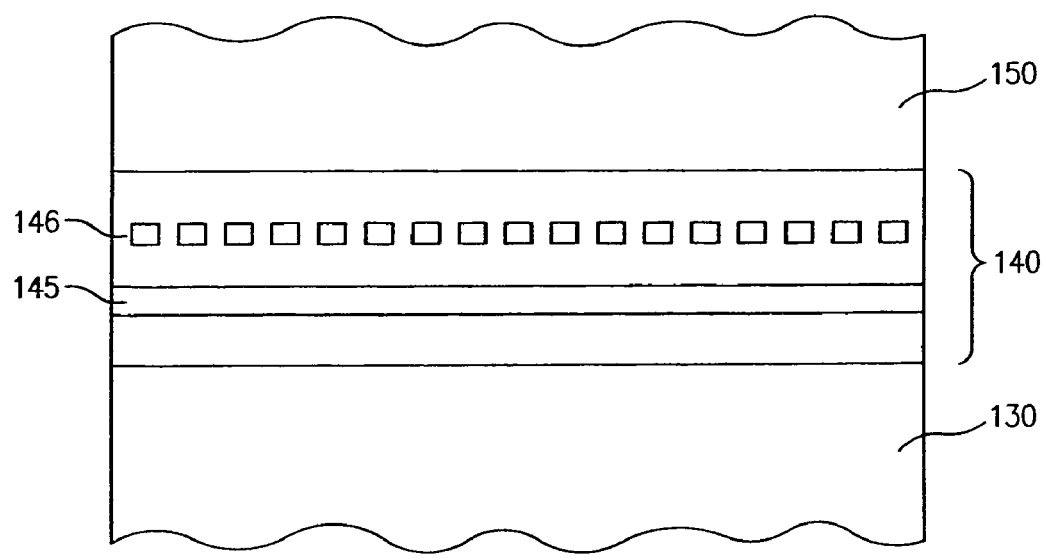
FIG. 5B shows a portion of a device employing a quantum well and, spaced therefrom, a layer of quantum dots.

FIG. 5A shows use of one or more regions of quantum dots, 143, 144, in the base region 140 of the FIG. 1 device (or other embodiments), these quantum dot regions being operative, as described in the referenced prior applications, to enhance the recombination process for improved device speed, modulation characteristics, and/or to tailor the spectral characteristics of the device. A combination of a quantum well 145, spaced apart from a layer of quantum dots 146 (see U.S. Pat. No. 6,753,273), can also be utilized in the base region of devices hereof.

Figure 6:
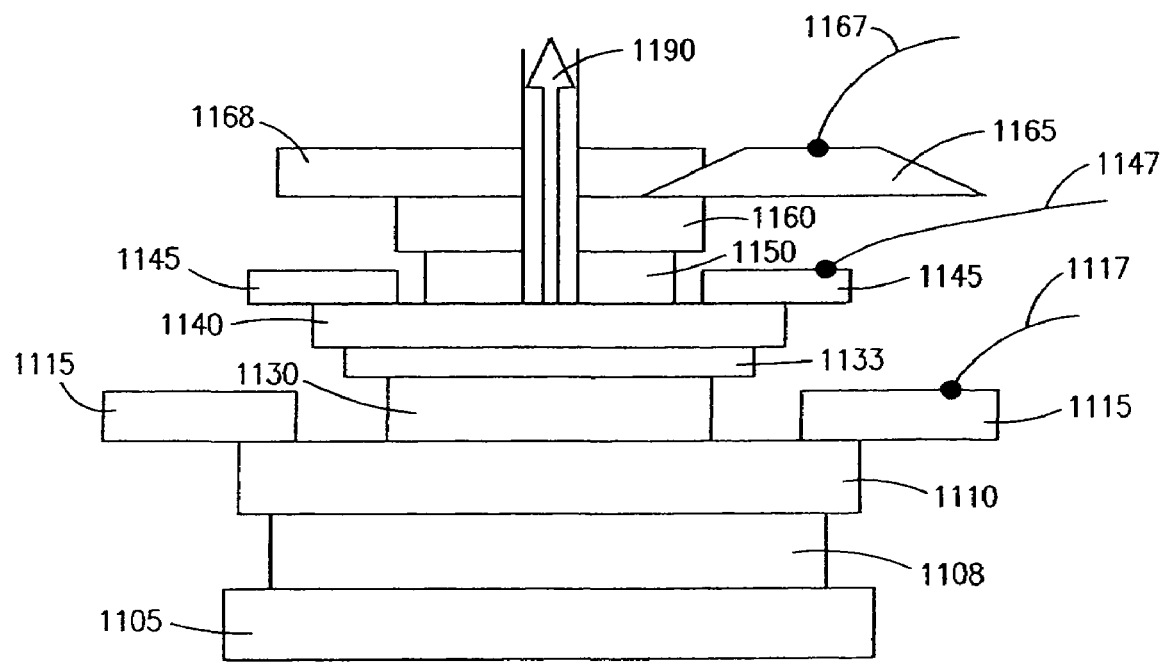
FIG. 6 is a simplified cross-sectional diagram, not to scale, of a vertical cavity surface emitting laser as described in the referenced prior applications.

FIG. 6 shows a vertical cavity surface emitting laser as described in the referenced prior applications, which employs light emission from the base region of an HBT. A substrate 1105 is provided, and the following layers are provided thereon. DBR reflector layer 1108, subcollector 1110, collector 1130, transition layer 1133, base 1140, emitter 1150, emitter cap layer 1160 and top DBR reflector layer 1168. Also shown are collector metallization 1115, base metallization 1145, and emitter metallization 1165. Collector lead 1117, base lead 1147, and emitter lead 1167 are also shown. In a form of this embodiment, the layers were grown by MOCVD, the substrate 1105 is a semi-insulating InP substrate, subcollector 1110 is n+ InGaAs, collector 1130 is n− InP, the base 1140 is a p+ InGaAs layer with a quantum well, the emitter 1150 is n-type InP, and the emitter cap 1160 is n+ InGaAs. Also, the transition layer is an n-type quaternary transition layer, for example InGaAsP. In this embodiment, the reflector layers 1108 and 1168 are multiple layer DBR reflectors, which can be spaced apart by suitable distance, such as a half wavelength. In operation, as before, with signals applied in three terminal mode, modulation of the base current produces modulated light emission, in this case vertically emitted laser light represented by arrow 1190. As noted in the referenced prior applications, other configurations and material systems can be used, including, as examples, GaAs and GaN based HBTs, or other direct bandgap material systems. Also, the base layer 1140 can be provided with quantum well(s) or dot layer(s), as described elsewhere herein.

Figure 7:
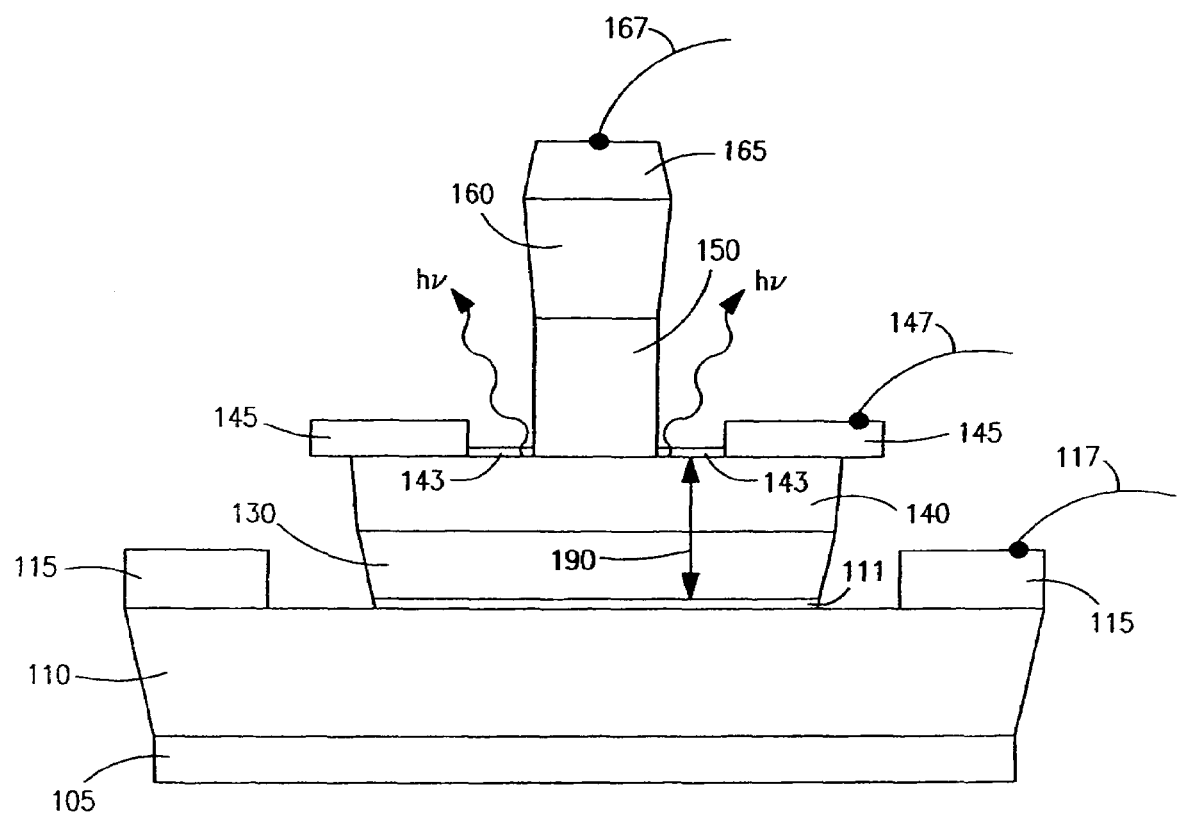
FIG. 7 is a simplified cross-sectional diagram, not to scale, of another vertical cavity surface emitting laser as described in the referenced prior applications.

FIG. 7 shows a further embodiment of a vertical cavity surface emitting laser, as described in the referenced prior applications, which has a Bragg reflector as close as possible to the collector and with elimination of intervening lower gap absorbing layers between the DBRs. In particular, in FIG. 7 (which has like reference numerals to FIG. 1 for corresponding elements), the lower DBR is shown at 111, and an upper DBR is shown at 143. Arrow 190 represents the optical standing wave of the VCSEL. The DBR 143 can be a deposited Si—SiO$_2$ Bragg reflector. A further reflector can also be provided on the top of emitter 150. Again, the base layer 140 can be provided with quantum well(s) or dot layer(s), as described elsewhere herein.

Figure 8:
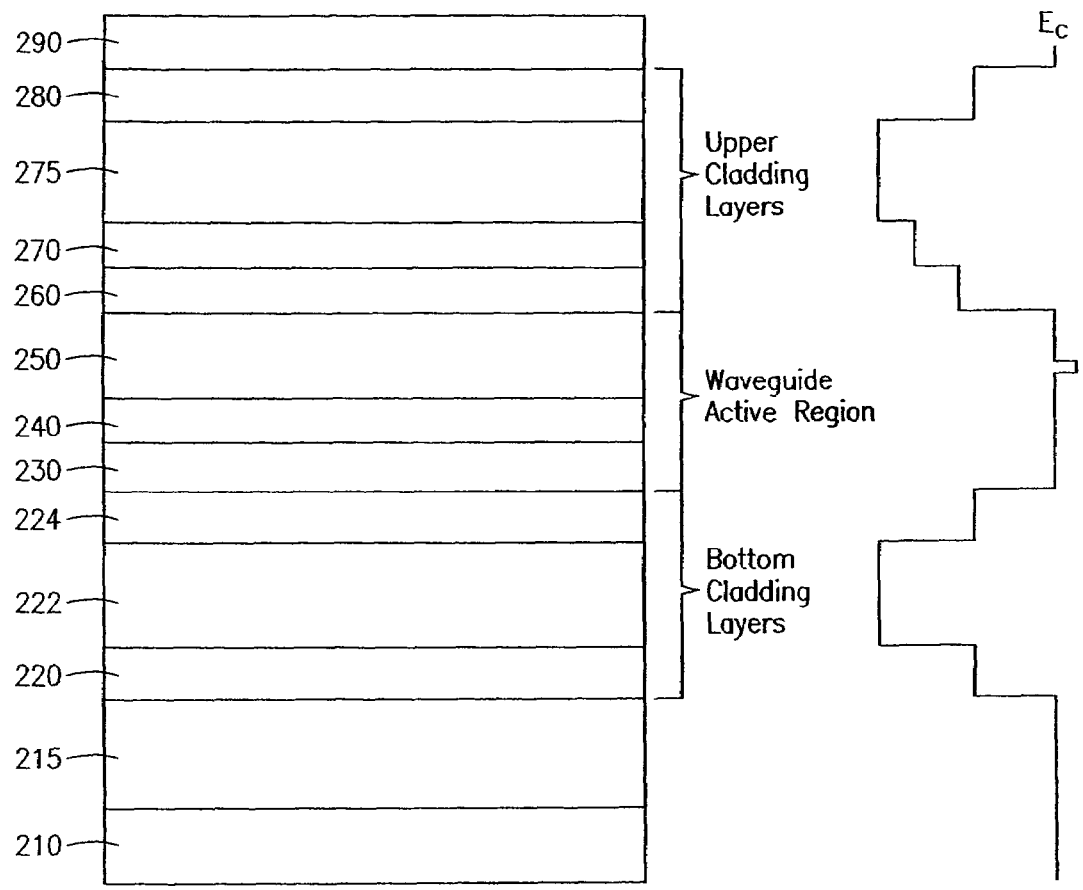
FIG. 8 shows, on the left, a diagram, not to scale, of the epitaxial layers of a crystal used for making a heterojunction bipolar light-emitting transistor (HBLET) and laser as described in the referenced prior applications, and, on the right, a corresponding band diagram.

FIG. 8 illustrates a laser transistor device as disclosed in the referenced copending application Ser. No. 11/068,561. This device demonstrated laser operation of an InGaP—GaAs—InGaAs heterojunction bipolar light-emitting transistor (HBLET) with AlGaAs confining layers and an InGaAs recombination quantum well incorporated in the p-type base region. The epitaxial layers of the crystal used for the HBLET laser are shown schematically in FIG. 8, and include: a GaAs substrate 210, a 4000 Å n-type heavily doped GaAs buffer layer 215, followed by a 600 Å n-type Al$_{0.40}$Ga$_{0.60}$As layer 220, a 3500 Å n-type Al$_{0.98}$Ga$_{0.02}$As layer 222, and a 400 Å n-type Al$_{0.40}$Ga$_{0.06}$As layer 224 forming the bottom cladding layers. These layers were followed by a 400 Å n-type sub-collector layer 230, then a 200 Å In$_{0.49}$Ga$_{0.51}$P etch stop layer (not shown), a 650 Å undoped GaAs collector layer 240, and a 940 Å p-type GaAs base layer 250 (the active layer), which includes also (in the base region) a 120 Å InGaAs QW (designed for λ≈980 nm). The epitaxial HBLET laser structure was completed with the growth of the upper cladding layers, which included a 1200 Å n-type In$_{0.49}$Ga$_{0.51}$P wide-gap emitter layer 260, a 300 Å n-type Al$_{0.70}$Ga$_{0.30}$As oxidation buffer layer 270, a 3500 Å n-type Al$_{0.98}$Ga$_{0.02}$As oxidizable layer 275 (see J. M. Dallesasse, N. Holonyak, Jr., A. R. Sugg, T. A. Richard, and N. El-Zein, Appl. Phys. Lett. 57, 2844 (1990)), and a 1000 Å n-type Al$_{0.40}$Ga$_{0.06}$As layer 280. Finally, the HBLET laser structure was capped with a 1000 Å heavily doped n-type GaAs contact layer 290. As described further in the referenced copending Application, the HBLET laser fabrication was performed by first patterning 6 μm protective SiN$_4$ stripes on the crystal. The top n-type Al$_{0.98}$Ga$_{0.02}$As oxidizable layer was then exposed by wet etching (1:8:160 H$_2$O$_2$:H$_2$SO$_4$:H$_2$O) to form a ~6 μm emitter mesa. Next, a wide 150 μm protective photoresist (PR) stripe was placed over the emitter mesa and the unprotected Al$_{0.98}$Ga$_{0.02}$As layer was completely removed (1:4:80 H$_2$O$_2$:H$_2$SO$_4$:H$_2$O), revealing the In$_{0.49}$Ga$_{0.51}$P wide-gap emitter layer. The protective PR stripe was then removed and the sample was oxidized for 7.5 min at 425° C. in a furnace supplied with N$_2$+H$_2$O, resulting in a ~1.0 μm lateral oxidation which formed ~4 μm oxide-defined apertures in the 6 μm emitter mesa (see, again, J. M. Dallesasse, N. Holonyak, Jr., A. R. Sugg, T. A. Richard, and N. El-Zein, supra (1990); S. A. Maranowski, A. R. Sugg, E. I. Chen, and N. Holonyak, Jr., Appl. Phys. Lett. 63, 1660 (1993)). The samples were annealed (in N$_2$) at 430° C. for 7 minutes to reactivate p-dopants before the protective SiN$_4$ was removed by plasma (CF$_4$) etching. A 100 μm PR window was formed over the emitter mesa and oxide layer, and Au—Ge/Au was deposited over the sample to form metal contact. After lift-off of the photoresist (PR) to remove excess metal, the In$_{0.49}$Ga$_{0.51}$P layer was removed using a wet etch (4:1 HCl:H$_2$O), exposing the p-type GaAs base layer. An 80 μm wide PR window was then patterned ~15 μm away from the emitter mesa edge, and Ti—Pt—Au was evaporated for contact to the base. Another lift-off process was then performed to remove excess base contact metal. A 150 μm PR window was then patterned ~6 μm away from the base contact. The GaAs base and collector layers were removed using a selective etch (4:1 C$_6$H$_8$O$_7$:H$_2$O$_2$), and the In$_{0.49}$Ga$_{0.51}$P etch-stop layer was removed by a wet etch (16:15 HCl:H$_2$O), exposing the heavily doped n-type GaAs sub-collector layer. Au—Ge/Au metal alloy was evaporated over the sample for contact to the exposed sub-collector layer, and another lift-off process was performed to remove excess metal. The sample was then lapped to a thickness of ~75 μm and the contacts annealed. The HBLET samples were cleaved normal to the emitter stripes to form Fabry-Perot facets, and the substrate side of the crystal was alloyed onto Cu heat sinks coated with In. Reference can be made to the prior copending application Ser. No. 11/068,561 for further details.

FIGS. 9, 10, 11, and 12 show devices and systems in accordance with embodiments of the invention and which can be used in practicing embodiments of the invention. In many respects, the devices of FIGS. 9-12 can be similar to light-emitting bipolar transistor devices as disclosed in the referenced prior applications and as also disclosed hereinabove, but with the improvements regarding the base region and its contacts, the associated electrical circuitry, and the resultant optical outputs. Accordingly, the embodiments to be described can employ any of the types of layer configurations that have been set forth or referenced, as well as other suitable configurations. For ease of illustration, only some of the basic device layers are illustrated in the FIGS. 9-12, and the laser cavity reflectors are implied.

Figure 9:
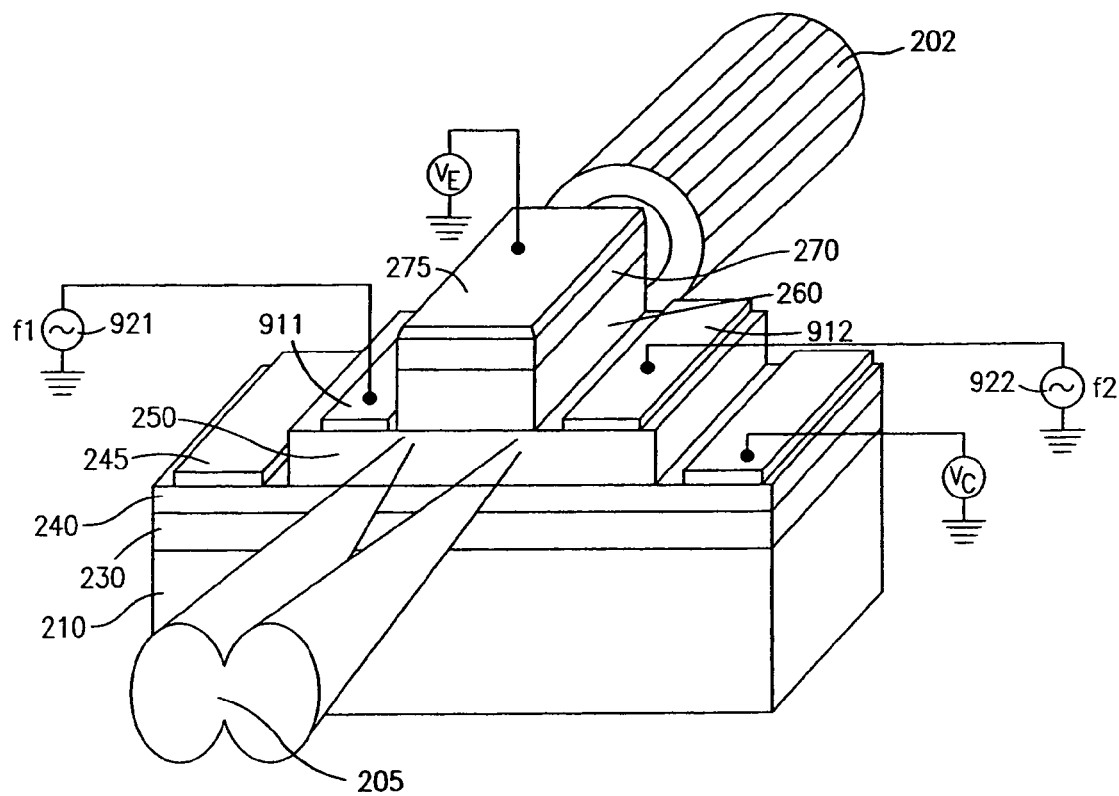
FIG. 9 is a diagram, partially in cross section and partially in schematic form, of a device and system in accordance with an embodiment of the invention, and which can be used in practicing an embodiment of the method of the invention.

The FIG. 9 embodiment shows a heterojunction bipolar laser transistor that includes substrate 210, subcollector 230, collector 240, collector electrode 245, base 250, emitter 260, emitter cap 270, and emitter electrode 275. Potentials designated $V_E$ and $V_C$ are respectively coupled with the emitter and collector electrodes. An optical coupling 202, such as a fiber optical coupling is coupled with the base region, and the laser output, most of all or which is actually input to the optical coupling, is illustrated at 205, it being understood that the side of the device opposite the optical coupling 202 will actually reflect most of the laser output that would otherwise exit as shown.

In the embodiment of FIG. 9, a pair of spaced-apart base electrodes, 911 and 912, contact the base region 250. In the present example, the device is biased in forward active mode; that is, as described in the referenced prior applications, with forward-biased base-emitter junction and reverse-biased base-collector junction. In the present embodiment, a signal generator 921 produces a first signal at a frequency $f_1$, which is applied to base electrode 911, and a signal generator 922 produces a second signal at a different frequency, f2, which is applied to base electrode 912. In this embodiment, the signals are relatively small sinusoidal and/or square wave microwave signals. The base current is maintained higher than the device threshold current (see the abovereferenced copending U.S. patent application Ser. No. 11/068,561, the parent Application hereof, which is incorporated by reference), and the resultant stimulated emission from dual "stripe" lasers (under the respective electrodes 911 and 912) are coupled with each other. For the signals at frequencies f1 and f2, output frequencies, including beat frequencies, are expected to be observed at f1, f2, f1+f2, |f1−f2|, 2f1+f2, 2f2+f1, |2f1−f2|, |2f2−f1|, and so on. Output optical pulses with frequencies 10 GHz and well beyond are produced. It will be understood that the mixing of microwave signals to obtain up and down frequency conversion for modulated transistor laser output has particular advantage for various applications, including, for example, communications and optoelectronic integrated circuits.

Figure 10:
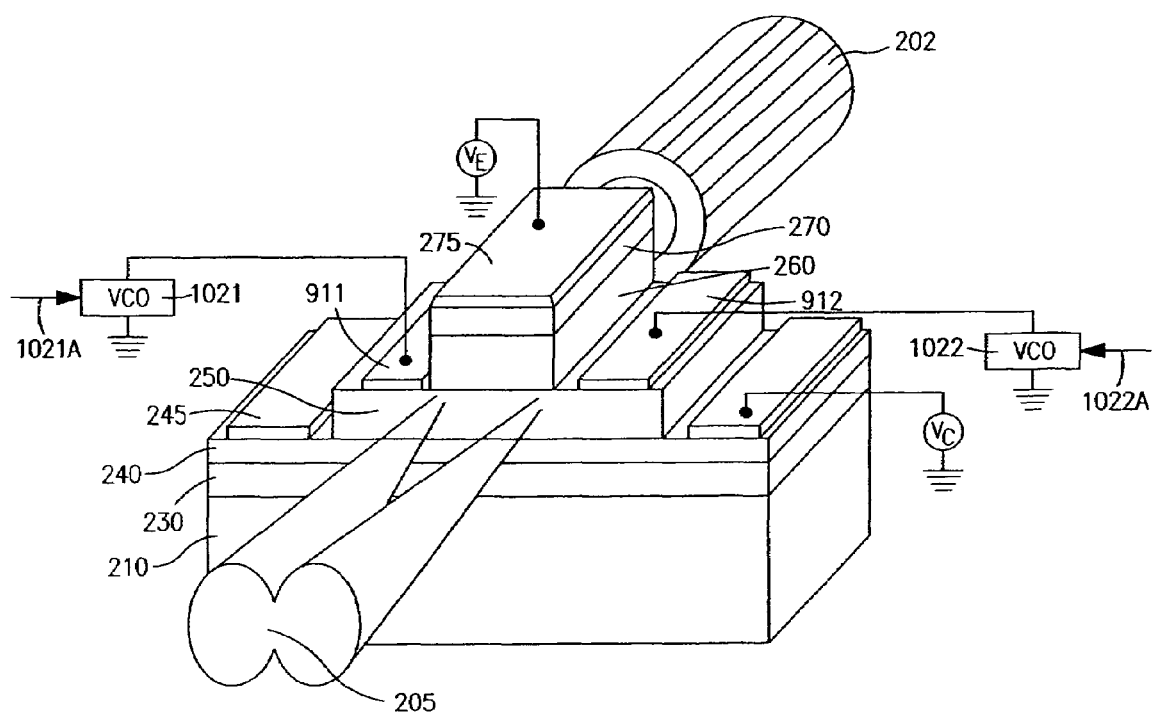
FIG. 10 is a diagram, partially in cross section and partially in schematic form, of a device and system in accordance with another embodiment of the invention, and which can be used in practicing another embodiment of the method of the invention.

The embodiment of FIG. 10 has the outputs of voltage controlled oscillators 1021 and 1022 coupled with the respective base electrodes 911 and 912. In this embodiment, each of the voltage controlled oscillators 1021 and 1022 receives a respective control signal, on respective lines 1021A and 1022A. As described in conjunction with the previous embodiment, when the frequencies input to the respective base electrodes are f1 and f2, output frequencies, including beat frequencies, are expected to be observed at f1, f2, f1+f2, |f1−f2|, 2f1+f2, 2f2+f1, |2f1−f2|, |2f2−f1|, and so on. By inputting suitable control signals, the advantage of flexible tunabililty is achieved.

Figure 11:
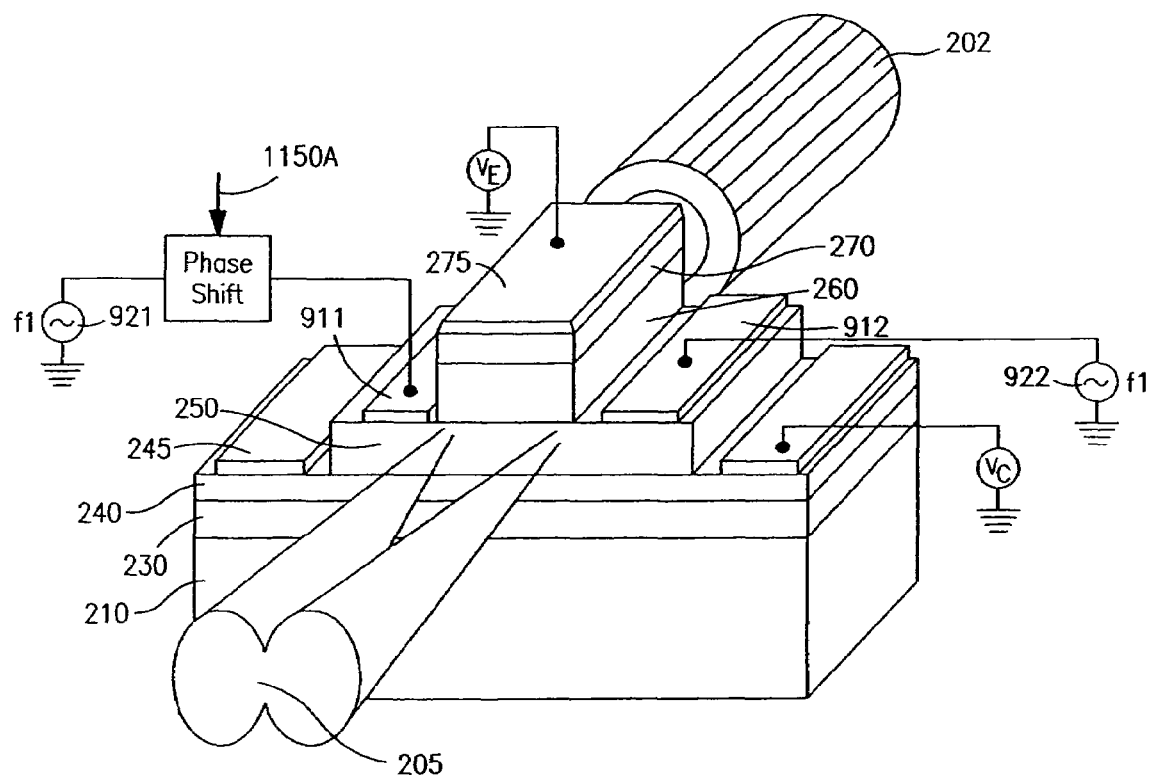
FIG. 11 is a diagram, partially in cross section and partially in schematic form, of a device and system in accordance with a further embodiment of the invention, and which can be used in practicing a further embodiment of the method of the invention.

The embodiment of FIG. 11 includes signal sources 921 and 922 as in FIG. 9, but in this embodiment the output of signal generator 921 is coupled to the base electrode 911 via phase shifter 1150. The phase shift implemented by block 1150 is controlled by an input on line 1150A, and can range from 0 degrees to 360 degrees to achieve phase shift modulation mixing in the output laser.

Figure 12:
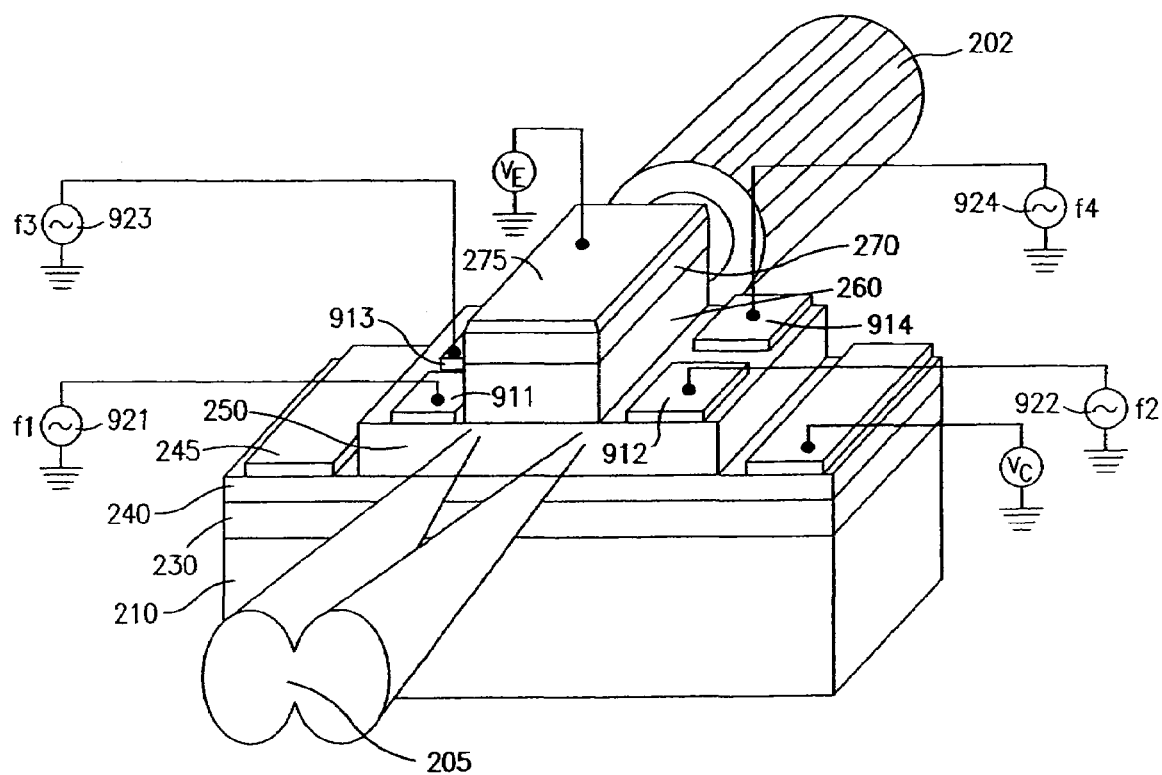
FIG. 12 is a diagram, partially in cross section and partially in schematic form, of a device and system in accordance with a still further embodiment of the invention, and which can be used in practicing a still further embodiment of the method of the invention.

Although two base electrodes are illustrated in the foregoing embodiments, it will be understood that other suitable pluralities of base electrodes can be employed with some or all having independent control. In the embodiment of FIG. 12, for example, four input signals, from sources 911, 912, 913 and 914, are respectively coupled with base electrodes designated 921, 922, 923, and 924.

Figure 13:
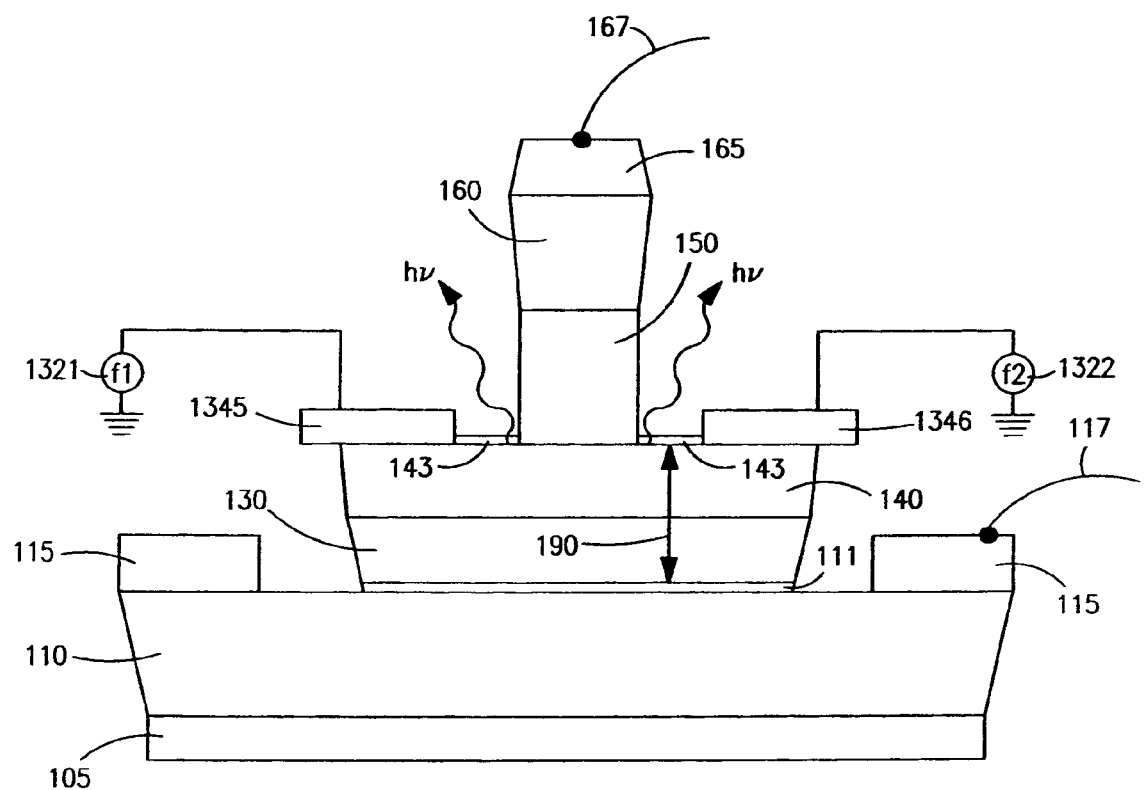
FIG. 13 shows the device of FIG. 7, but with segmented base metallizations.

The embodiments of FIGS. 9-12 illustrate operation in terms of an edge-emitting bipolar transistor, but it will be understood that each of the embodiments can be implemented in conjunction with a vertical cavity bipolar transistor, such as those of FIG. 6 or 7. FIG. 13 shows the device of FIG. 7, but with segmented base metallizations 1345 and 1346. Respectively coupled therewith are the outputs of signal generators 1321 and 1322, operating at frequencies f1 and f2, respectively (as in FIG. 9). It will be understood that analogs of the embodiments of FIGS. 10-12, in the context of vertical cavity emitting bipolar devices, can also be implemented. Further, if suitable reflectors are provided for both edge emission and vertical emission, devices can be adapted for operation that switches between edge emitting and vertical emitting modes.

The invention claimed is:

1. Apparatus for receiving first and second electrical signals and producing an optical output as a function of said first and second electrical signals; comprising:
    a bipolar light-emitting transistor device that includes collector, base, and emitter regions;
    a collector electrode coupled with said collector region and an emitter electrode coupled with said emitter region, whereby electrical potentials can be coupled with said collector and emitter regions;
    an optical coupling in optical communication with said base region; and
    first and second base electrodes coupled with said base region;
    said first and second electrical signals being respectively coupled with said first and second base electrodes, whereby an optical output, which is a function of said first and second electrical signals, is emitted from said base region and coupled into said optical coupling.

2. Apparatus as defined by claim 1, wherein said base region is within an optical resonant cavity that includes a reflector that is at least partially reflective of optical radiation, and wherein said optical output comprises laser output.

3. Apparatus as defined by claim 2, wherein said laser output comprises a plurality of coupled laser beams.

4. Apparatus as defined by claim 2, wherein said laser output comprises first and second coupled laser beams.

5. Apparatus as defined by claim 1, wherein said first electrical signal has a frequency f1, said second electrical signal has a frequency f2, and said optical output includes a frequency component from the group consisting of f1+f2, |f1−f2|, 2f1+f2, 2f2+f1, |2f1−f2|, and |2f2−f1|.

6. Apparatus as defined by claim 4, wherein said first electrical signal has a frequency f1, said second electrical signal has a frequency f2, and said optical output includes a frequency component from the group consisting of f1+f2, |f1−f2|, 2f1+f2, 2f2+f1, |2f1−f2|, and |2f2−f1|.

7. Apparatus as defined by claim 1, wherein said optical coupling comprises an optical fiber.

8. Apparatus as defined by claim 2, wherein said optical coupling comprises an optical fiber.

9. Apparatus as defined by claim 1, wherein said base region includes at least one layer exhibiting quantum size effects.

10. Apparatus as defined by claim 1, wherein said at least one layer exhibiting quantum size effects comprises at least one quantum well.

11. Apparatus as defined by claim 1, further comprising first and second controllable oscillators for producing said first and second electrical signals.

12. Apparatus as defined by claim 2, further comprising first and second controllable oscillators for producing said first and second electrical signals.

13. Apparatus for receiving a plurality of electrical signals and producing an optical output as a function of said plurality electrical signals; comprising:
- a bipolar light-emitting transistor device that includes collector, base, and emitter regions;
- a collector electrode coupled with said collector region and an emitter electrode coupled with said emitter region, whereby electrical potentials can be coupled with said collector and emitter regions;
- an optical coupling in optical communication with said base region; and
- a plurality of electrodes coupled with said base region;
- said plurality of electrical signals being respectively coupled with said plurality of base electrodes, whereby an optical output, which is a function of said first and second electrical signals, is emitted from said base region and coupled into said optical coupling.

14. Apparatus as defined by claim 13, wherein said plurality of electrical signals comprises four electrical signals, and said plurality of base electrodes comprises four electrodes.

15. Apparatus as defined by claim 13, wherein said transistor device is a laser device, and said optical output is a laser output.

16. Apparatus as defined by claim 14, wherein said transistor device is a laser device, and said optical output is a laser output.

17. Apparatus as defined by claim 15, wherein said optical coupling comprises an optical fiber.

18. Apparatus as defined by claim 13, wherein said transistor is an edge emitting laser device, and said optical output is a laser output.

19. Apparatus as defined by claim 13, wherein said transistor is vertical cavity laser device, and said optical output is a laser output.

* * * * *